United States Patent
Nelson

(10) Patent No.: US 7,496,170 B2
(45) Date of Patent: Feb. 24, 2009

(54) DIGITALLY CONTROLLED OSCILLATOR HAVING ENHANCED CONTROL RESOLUTION

(75) Inventor: Dale H. Nelson, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 214 days.

(21) Appl. No.: 11/439,913

(22) Filed: May 24, 2006

(65) Prior Publication Data

US 2006/0215798 A1  Sep. 28, 2006

(51) Int. Cl.
*H03D 3/24* (2006.01)
(52) U.S. Cl. .................. 375/376; 324/147
(58) Field of Classification Search ............ 375/376
See application file for complete search history.

(56) References Cited

U.S. PATENT DOCUMENTS

| | | | | |
|---|---|---|---|---|
| 4,577,163 | A * | 3/1986 | Culp | 331/1 A |
| 5,057,794 | A * | 10/1991 | Shih | 331/1 A |
| 5,168,245 | A * | 12/1992 | Koskowich | 331/1 A |
| 5,495,205 | A * | 2/1996 | Parker et al. | 331/1 A |
| 6,211,739 | B1 * | 4/2001 | Synder et al. | 331/1 A |
| 6,515,553 | B1 * | 2/2003 | Filiol et al. | 332/127 |
| 2004/0228430 | A1 * | 11/2004 | Moy et al. | 375/376 |
| 2004/0247066 | A1 * | 12/2004 | Suda | 375/376 |

* cited by examiner

*Primary Examiner*—David C Payne
*Assistant Examiner*—Leon-Viet Q Nguyen
(74) *Attorney, Agent, or Firm*—Ryan, Mason & Lewis, LLP

(57) ABSTRACT

A signal generator circuit having enhanced control resolution includes a variable frequency oscillator having a first control input adapted to receive a first signal and at least a second control input adapted to receive a second signal. The second signal is afforded a weight which is substantially equal to a weight of a least significant bit of the first signal. The variable frequency oscillator is operative to generate an output signal having a frequency which varies as a function of the first and second signals. The signal generator circuit further includes a first counter, a first divider and a modulation circuit. The first counter is configurable for generating an output count based at least in part on a difference between a third signal presented to the signal generator circuit and a fourth signal indicative of the output signal, the output count including the first signal. The first divider has a selectable divide value associated therewith and is configurable for receiving the output signal and for generating the fourth signal based on the divide value. The modulation circuit is adapted to receive at least a portion of the output count and the fourth signal and to generate the second signal as a function of the output count and the fourth signal.

20 Claims, 5 Drawing Sheets

DIGITALLY CONTROLLED OSCILLATOR HAVING ENHANCED CONTROL RESOLUTION

CROSS-REFERENCE TO RELATED APPLICATION(S)

This application is related to commonly assigned U.S. application entitled "Digital Phase-Locked Loop" filed on May 28, 2004 and assigned application Ser. No. 10/856,447, the disclosure of which is incorporated by reference herein.

FIELD OF THE INVENTION

The present invention relates generally to the field of electronic circuits, and more particularly relates to digitally controlled oscillators (DCOs).

BACKGROUND OF THE INVENTION

In high-performance very large scale integration (VLSI) systems, such as, for example, a data transmission system, it is often desirable to provide a signal at a variable frequency, with the frequency of the signal being set by a digital control word. This frequency should be able to be set within a prescribed bandwidth of the spectrum with a desired level of accuracy. To generate the signal, DCO circuits are often employed.

A DCO is an electronic system for synthesizing a wide range of frequencies from a fixed timebase. DCOs have a number of advantages over their phase-locked loop (PLL)-based analog counterparts: they are more flexible and usually more stable, assuming the timebase is substantially stable. Furthermore, for most controlled oscillators, frequency gain is a compromise between conflicting design objectives. A high gain is beneficial for achieving a wide frequency range, with the tradeoff being that it introduces frequency jitter when the control signal is noisy. In principle, this gain tradeoff is not applicable to a DCO because the noise immunity of its control input is very high.

Despite the excellent noise immunity of its control input, it is widely recognized that the jitter performance of a conventional DCO remains substantially worse compared to the jitter performance of its analog counterparts. This jitter is due, at least in part, to the fact that in a DCO the oscillator runs at discrete periods, thus producing an output signal having discrete frequencies associated therewith as a function of a digital control word presented to the control input of the DCO. The DCO is only capable of generating frequencies that are less than half the timebase frequency, due to Nyquist's theorem. In many systems, a divided down output of the oscillator is used and the amount of jitter introduced by the DCO is multiplied by the divide down value, thereby exacerbating the jitter problem. Previous techniques aimed at reducing jitter have generally involved increasing a resolution of the DCO. This approach, however, significantly increases the complexity, power consumption and silicon area of the DCO and is therefore undesirable.

Accordingly, there exists a need for a DCO having enhanced control resolution which does not suffer from one or more of the problems exhibited by conventional DCOs.

SUMMARY OF THE INVENTION

The present invention meets the above-noted need by providing, in an illustrative embodiment thereof, a DCO having enhanced control resolution.

In accordance with one aspect of the invention, a signal generator circuit having enhanced control resolution includes a variable frequency oscillator having a first control input adapted to receive a first signal and at least a second control input adapted to receive a second signal. The second signal is afforded a weight which is substantially equal to a weight of a least significant bit of the first signal. The variable frequency oscillator is operative to generate an output signal having a frequency which varies as a function of the first and second signals. A comparator in the signal generator circuit is configurable for receiving a third signal and a fourth signal, the third signal being an input signal presented to the signal generator circuit and the fourth signal being representative of the output signal from the variable frequency oscillator. The comparator generates a difference signal representative of a difference between a phase and/or frequency of the third and fourth signals.

The signal generator circuit further includes a first counter, a first divider and a modulation circuit. The first counter is configurable for generating an output count based at least in part on the difference signal from the comparator, the output count including the first signal and being a digital representation of the difference signal. The first divider is connected between the variable frequency oscillator and the comparator. The first divider has a selectable divide value associated therewith and is configurable for receiving the output signal from the variable frequency oscillator and for generating the fourth signal based on the divide value. The modulation circuit is adapted to receive at least a portion of the output count and the fourth signal and to generate the second signal as a function of the output count and the fourth signal.

In an illustrative embodiment, the DCO includes a first control input adapted to receive a digital control word for controlling a frequency of an output signal generated by the DCO. In order to provide finer control resolution, the DCO further includes a second control input which is given a weight substantially equal to a weight of a least significant bit (LSB) of the first control input. The second control input is adapted to receive a modulated bit signal configurable for controlling, to a lesser extent than the digital control word, the frequency of the output signal. In this manner, the illustrative embodiment of the invention advantageously enhances the control resolution of the DCO without significantly increasing the complexity and/or the silicon area consumed by the DCO.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of a DCO. It should be understood, however, that the present invention is not limited to the particular circuit arrangements of the illustrative embodiments shown, and that other embodiments may include, but are not limited to, different types and numbers of loops, different functional blocks and circuitry implementations associated therewith, etc. Rather, embodiments of the present invention provide techniques for advantageously enhancing the control resolution of a DCO, without significantly increasing the complexity and/or the silicon area consumed by the circuit. Moreover, since the DCO employs a primarily digital architecture, the overall size of the DCO can be advantageously scaled with advances in integrated circuit process technology. The DCO formed in accordance with embodiments of the present invention is particularly well-suited for use in a wide variety of integrated circuit applications, as well as in non-integrated circuit applications.

Figure 1:
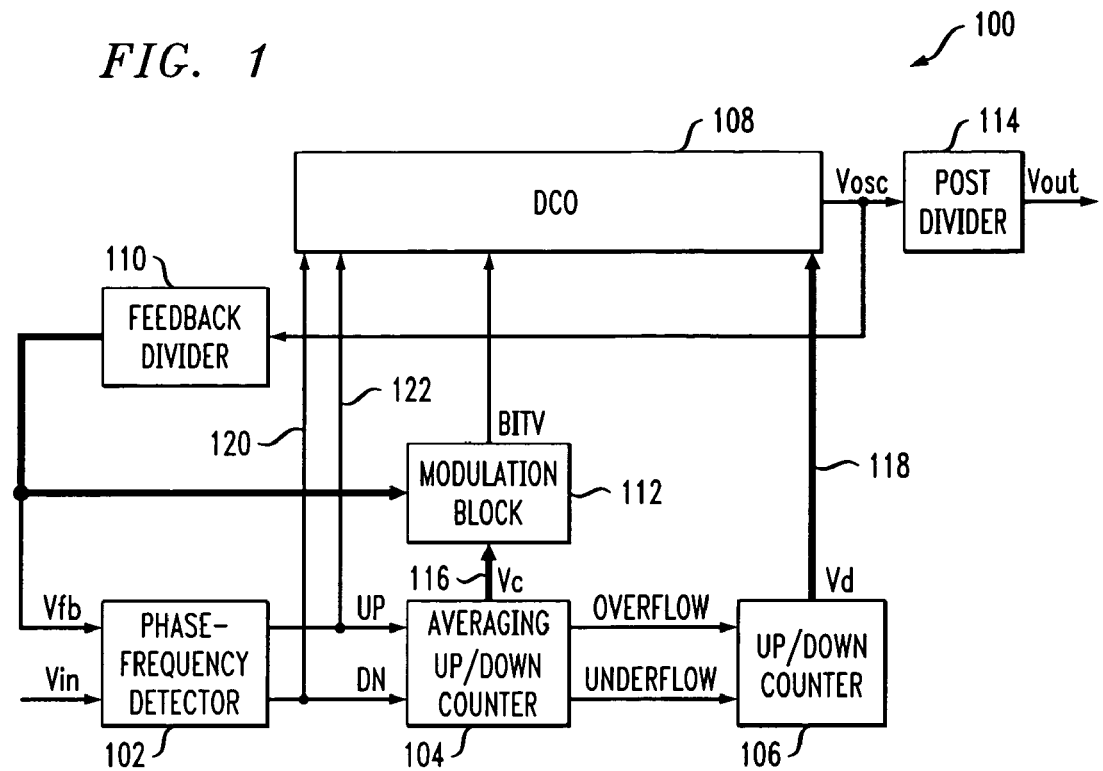
FIG. 1 is a block diagram illustrating at least a portion of an exemplary signal generator circuit, formed in accordance with an embodiment of the present invention are implemented.

FIG. 1 is a block diagram illustrating at least a portion of an exemplary signal generator circuit 100 in which the techniques of the present invention are implemented. The signal generator circuit 100 is preferably operable in a radio frequency (RF) frequency range (e.g., greater than about 350 megahertz (MHz)), although the invention is not limited to any particular frequency range of operation. Without loss of generality but for ease of explanation, the signal generator circuit 100 will be described in terms of functional blocks, including a phase-frequency detector (PFD) 102, an averaging up/down counter (UDC) 104, a second UDC 106, a DCO 108, or alternative variable frequency oscillator, a feedback divider 110, a modulation block 112, and a post divider 114. The PFD 102 may comprise only phase detection circuitry, only frequency detection circuitry, or a combination of phase and frequency detection circuitry, as will be understood by those skilled in the art. Thus, the term "phase-frequency detector" as used herein is intended to include phase detection and/or frequency detection functionalities. It is to be appreciated that in the exemplary signal generator circuit 100, one or more functional blocks may be optional (e.g., post divider 114 and averaging UDC 104), and therefore may be omitted in alternative embodiments of the invention.

Although shown as separate functional blocks, at least a portion of one or more of the blocks in the signal generator circuit 100 may be combined and/or integrated either with each other, or with one or more other functional blocks, and certain portions of the combined functional blocks may be shared, as will be understood by those skilled in the art. For example, the averaging UDC 104 and the second UDC 106 may be implemented as a single functional block. A more detailed description of the functional blocks in the signal generator circuit 100 is presented below.

The PFD 102 receives at a first input a reference signal, Vin, having a frequency $f_{IN}$ and a phase $\phi_{IN}$ associated therewith, and receives at a second input a feedback signal Vfb, having a frequency $f_{FB}$ and a phase $\phi_{FB}$ associated therewith. The feedback signal Vfb is preferably indicative of an output signal Vosc generated by the DCO 108, and may be, for example, the output signal Vosc itself (or a buffered version of Vosc) or a multiple thereof. As apparent from the figure, the output signal Vosc may be divided by one or more frequency dividers, such as, for example, feedback divider 110, coupled in series between an output of the DCO 108 and the second input of the PFD 102, thereby forming a feedback loop. The post divider 114, which may also be referred to as a postscaler, may be included in the signal generator circuit 100 for generating an output signal Vout of the signal generator circuit that is a selected division of the output signal Vosc of the DCO 108. A prescaler (not shown) may also be optionally employed in the signal generator circuit 100 for dividing the input reference signal Vin by a selected amount prior to being presented to the PFD 102. One or more of the dividers 110, 114 may be implemented in a conventional manner, such as, for example, using a programmable counter, although alternative divider and/or scaling circuitry may also be employed. Additionally, a divide value associated with one or more of the dividers 110, 114 may be selectively changed based on a corresponding control signal presented thereto.

PFD 102, which may comprise, for example, a conventional type-four phase detector, is preferably configurable for generating one or more control signals, UP and DN, indicative of a difference in phase and/or frequency between the signals Vin and Vfb applied to the first and second inputs, respectively, of the PFD. Signals UP and DN may comprise, for example, pulses having respective pulse widths that are indicative of a magnitude of the difference in phase and/or frequency between signals Vin and Vfb. Based on a comparison between the two signals Vin and Vfb, the PFD 102 preferably generates an UP pulse when $\phi_{IN}$ leads $\phi_{FB}$ (or similarly, when $f_{IN}$ leads $f_{FB}$) and generates a DN pulse when $\phi_{IN}$ lags $\phi_{FB}$ (or similarly, when $f_{IN}$ lags $f_{FB}$). It is to be appreciated that, while the PFD 102 in the exemplary signal generator circuit 100 preferably comprises a type-four phase detector, alternative circuitry operative to compare the phase and/or frequency of signals Vin and Vfb may also be employed, such as, for example, a multiplier, an exclusive-OR (XOR) gate, etc., as will be understood by those skilled in the art.

The averaging UDC 104 is adapted for receiving at first and second inputs the UP and DN signals, respectively, from the PFD 102 and for generating a control signal Vc which is supplied to the modulation block 112 via connection 116. Control signal Vc may comprise a multiple-bit signal that is representative of a count value of the averaging UDC 104, such as, for example, a binary representation of the count value, and thus connection 116 preferably comprises a bus. The averaging UDC 104 is preferably configured to increment the count value (count up) in response to a received UP signal, and to decrement the count value (count down) in response to a received DN signal. The value of the count may be based, at least in part, on the pulse widths of the respective UP and DN signals. For example, an UP signal having a longer pulse width may produce a higher count value compared to an UP signal having a shorter pulse width. In this manner, the resulting count value of the averaging UDC 104 will be indicative of a magnitude of the difference in phase and/or frequency between the signals Vin and Vfb.

Averaging UDC 104 preferably generates an OVERFLOW signal when the count value is greater than a maximum representable limit associated therewith (e.g., when the counter overflows). Likewise, the averaging UDC 104 preferably generates an UNDERFLOW signal when the count value is smaller in magnitude than a minimum representable limit associated therewith (e.g., when the counter underflows). The second UDC 106 is adapted for receiving the OVERFLOW and UNDERFLOW signals from the averaging UDC 104, and for generating a control signal Vd for controlling the DCO 108 via connection 118. Control signal Vd preferably comprises a multiple-bit digital control word that is indicative (e.g., a binary representation) of a count value of second UDC 106, and thus connection 118 may comprise a bus. Second UDC 106, like averaging UDC 104, may be implemented in a conventional fashion (e.g., a plurality of D-type flip-flops), as will be understood by those skilled in the art. Additionally, it is contemplated that averaging UDC 104 and second UDC 106 may be implemented as a single counter.

An overflow condition may occur when second UDC 106 attempts to decrease the frequency of the output signal Vosc of the DCO 108 below a minimum operational frequency range of the DCO, indicating that the DCO is running too fast. This may result from certain changes in the characteristics of the DCO, including, but not limited to, IC process, voltage and/or temperature (PVT) variations. When an overflow condition occurs, second UDC 106 is preferably incremented accordingly to increase a divide value of the DCO 108 and thereby decrease the frequency of the output signal Vosc. Likewise, an underflow condition may occur when second UDC 106 attempts to increase the frequency of the output signal Vosc above a maximum operational frequency range of the DCO 108, indicating that the DCO is running too slow. Again, this may result from certain PVT variations, among other characteristics of the DCO. When an underflow condition occurs, second UDC 106 is decremented to thereby decrease the divide value of the DCO 108. Alternatively, control signal Vd may be used to control the divide value of the feedback divider 110. This control methodology, which is another beneficial aspect of the present invention, involves controlling the division of the DCO output signal Vosc that is fed back to the PFD 102 as a function of the second UDC 106, thereby extending an effective frequency range of the DCO 108 without increasing the number of delay stages in the DCO. It is to be understood that a divide value of one or more of the feedback divider 110 and post divider 114 may also be selectively controlled, for example, based at least in part on the control signal Vd, to provide further design flexibility.

Second UDC 106 preferably serves as a primary means for controlling the frequency of the output signal Vosc generated by the DCO 108, replacing a conventional charge pump and loop filter which are generally found in an analog phase locked loop (PLL). By eliminating the loop filter, and particularly the large integrating capacitors associated therewith, the size of the signal generator circuit 100 can be significantly reduced in comparison to the size of a traditional analog PLL. Additionally, the second UDC 106 beneficially consumes substantially less current than the conventional charge pump. Therefore, the overall current consumption in the signal generator circuit 100 will be significantly less compared to the analog PLL.

Control signal Vd provided to the DCO 108 is preferably a digital representation of the difference in phase and/or frequency between the signals Vin and Vfb, as previously stated. Furthermore, the DCO 108 is a digital implementation of an analog VCO, and therefore the frequency of the output signal Vosc from the DCO will vary in discrete steps. The size of the steps in which the frequency of Vosc can be varied will depend, at least in part, on the respective resolutions of the DCO 108 (e.g., the number of delay stages in the DCO), the second UDC 106 (e.g., the number of bits associated with the counter), and the modulation block 112. For example, an 8-stage (e.g., 8-bit) DCO is capable of generating 256 discrete output frequencies.

Since the frequency of the output signal Vosc required to substantially match the feedback signal Vfb with the input reference signal Vin may reside somewhere between two discrete steps of the DCO, second UDC 106 may exhibit "hunting" by varying the count value up and down between two or more closest count values in an attempt to match the frequency of the output signal Vosc with the input reference signal Vin. This hunting effect, which is due primarily to quantization limitations inherent in the signal generator circuit 100 resulting from a combination of the discrete control signal Vd generated by the second UDC 106 and the discrete output frequencies of the output signal Vosc, contribute to jitter in the output signal Vout. As previously stated, this jitter is multiplied by the divide value of the output signal Vosc, and thus it is advantageous to minimize the jitter in the output signal Vosc as much as possible.

In order to reduce jitter in the output signal Vosc generated by the DCO 108, the resolution of the DCO can be increased by adding more delay stages to the DCO. The resolution of the second UDC 106 may also be increased in order to reduce jitter in the output signal Vosc, such as by adding more counter stages. Either of these standard approaches, however, increases the complexity, silicon area and cost of the IC and is therefore undesirable. In accordance with an embodiment of the invention, as a means of reducing jitter in the output signal Vout, the DCO 108 preferably includes a first control input adapted for receiving a digital control word supplied thereto (e.g., Vd), and at least a second control input adapted for receiving a modulated bit signal, BITV, generated by the modulation block 112. The modulated bit signal is preferably afforded a weight, at least for DCO control purposes, which is substantially equal to a weight of a least significant bit (LSB) of the digital control word. The modulated bit signal is preferably time division modulated to better approximate a desired average period of the output signal Vout. In this manner, the control resolution of the DCO can be beneficially enhanced without significantly increasing the complexity and/or size of the signal generator circuit 100.

The term "weight" as used herein is defined as a coefficient or other factor which is assigned to a signal (or signals) in order to represent an importance of the signal relative to one or more other signals. In the case of DCO 108, the modulated bit signal BITV being afforded a weight which is substantially equal to a weight of the LSB of the digital control word is meant to imply that the amount of influence of the modulated bit signal on controlling the frequency of the output signal Vout generated by the DCO is substantially the same as that of the LSB of the DCO digital control word.

Control signals UP and DN generated by the PFD 102 may be provided directly to the DCO 108 in order to eliminate or substantially reduce hunting in the signal generator circuit 100 via connections 122 and 120, respectively. The DCO 108 is preferably configured such that the frequency of the output signal Vosc is decreased in response to an UP pulse and is increased in response to a DN pulse. The amount of change in the frequency of the Vosc in response to the UP and DN signals is preferably significantly less than the amount of change in the frequency of Vosc in response to control signal Vd from the second UDC 106 (e.g., less than about ten percent). The methodology of the invention thus provides of means of adding hysteresis to the exemplary signal generator circuit 100.

Figure 2:
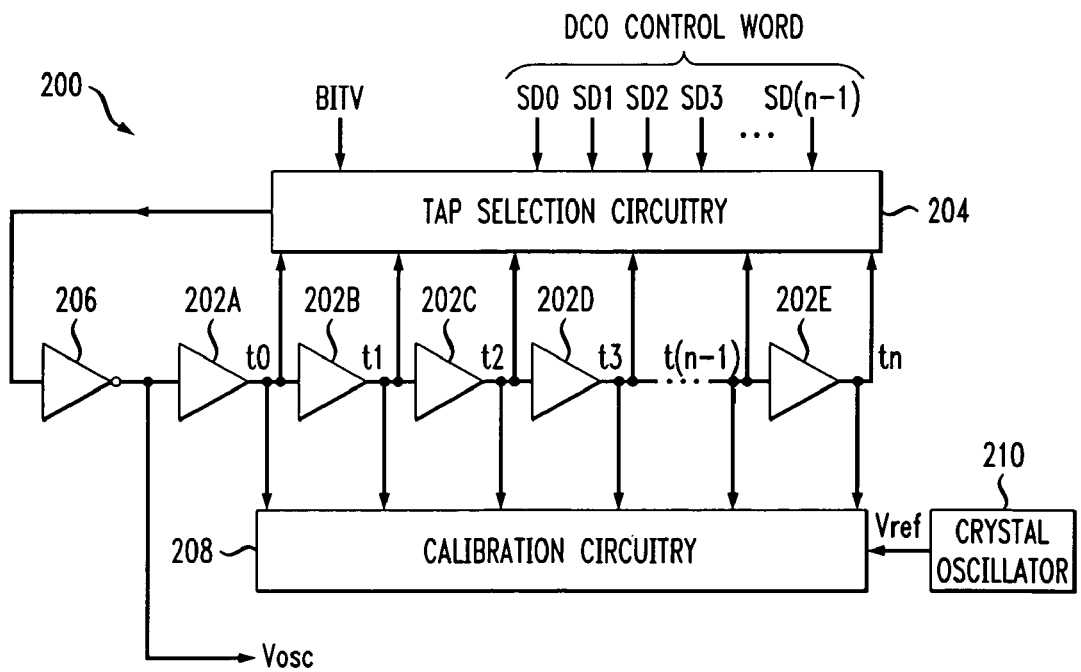
FIG. 2 is a block diagram depicting an illustrative DCO suitable for use in the signal generator circuit of FIG. 1, in accordance with one embodiment of the invention.

FIG. 2 is a block diagram depicting an illustrative DCO 200 suitable for use in the signal generator circuit 100 of FIG. 1, in accordance with one embodiment of the invention. One skilled in the art will appreciate that various alternative DCO circuits may also be employed. The DCO 200 preferably includes a plurality of delay stages 202A through 202E connected together in a series chain configuration as shown, with an output of one delay stage (e.g., 202A) connected to an input of a successive delay stage (e.g., 202B), and so forth until the chain is closed, thereby forming a ring, through tap selection circuitry 204, or an alternative switching arrangement, and a buffer 206.

The delay stages, which may be referred to collectively as 202, are shown as non-inverting delay stages, although inverting delay stages (e.g., inverters) are similarly contemplated. It is to be understood that the DCO 200 is not limited to the particular number and/or type of delay stages shown in the illustrative embodiment thereof. A polarity (e.g., non-inverting or inverting) of buffer 206, in combination with a polarity of the overall chain of delay stages 202, is preferably selected so as to provide positive feedback for sustaining oscillation. For instance, when non-inverting delay stages 202 or an even number of inverting delay stages are employed, buffer 206 should also be non-inverting, assuming tap selection circuitry 204 is non-inverting. An output signal, Vosc, of the DCO 200 is preferably generated at an output of the buffer 206, although the output signal may alternatively be taken from any of the delay stages 202. An additional buffering stage or stages (not shown) may be included to further buffer the output signal Vosc.

Outputs, t0 through tn, also referred to herein as taps, of the respective delay stages 202 are preferably supplied to the tap selection circuitry 204. Tap selection circuitry 204 is preferably adapted for receiving at least the DCO control word, as may be generated by second UDC 106 depicted in FIG. 1, and the modulated bit signal BITV, as may be generated by modulation block 112 (see FIG. 1), and for selecting, as an output of the tap selection circuitry 204, one of the plurality of taps (e.g., t0 through tn) as a function of the DCO control word and the signal BITV. The illustrative n-stage DCO 200 is preferably configured to receive an (n−1)-bit control word comprising select delay signals SD0 through SD(n−1), where SD0 is an LSB and SD(n−1) is a most significant bit (MSB) of the control word, although this assignment is essentially arbitrary. As previously stated, the signal BITV is afforded a weight which is substantially equal to a weight of the LSB of the control word, namely, SD0. Signal BITV is preferably generated as a time modulation signal of at least a portion of the output from the averaging UDC 104 and at least a portion of the output from the feedback divider 110 (see FIG. 1).

The frequency of the output signal Vosc of the DCO 200 is based primarily on the respective delays associated with each of the delay stages 202 and the number of delay stages in the ring. Assuming that the delay stages 202 have fixed delays associated therewith, the number of delay stages in the ring may be selectively varied as a means of controlling the frequency of the DCO output signal Vosc. Alternatively, the DCO may be configured having a fixed number of delay stages and a frequency of the output signal Vosc varied by controlling the respective delays of the delay stages (e.g., by changing a capacitive loading at the input of each stage). Regardless of the frequency controlling mechanism employed, the DCO 200 is preferably configured such that at least a portion of the control word signals SD0 through SD(n−1) are weighted, such as, for example, in a binary weighting arrangement.

DCO 200 may further include calibration circuitry 208. The calibration circuitry 208 is preferably operative to compare a frequency at one or more taps of the delay stages 202 with a reference signal, Vref, which may be generated, for example, by a crystal oscillator 210 or alternative frequency reference source. Calibration circuitry 208 may comprise, for example, a capacitance network or alternative loading arrangement, operative to selectively vary a delay of one or more of the delay stages 202 by a prescribed amount, and thereby adjust the frequency of the output Vosc as desired.

Figure 3:
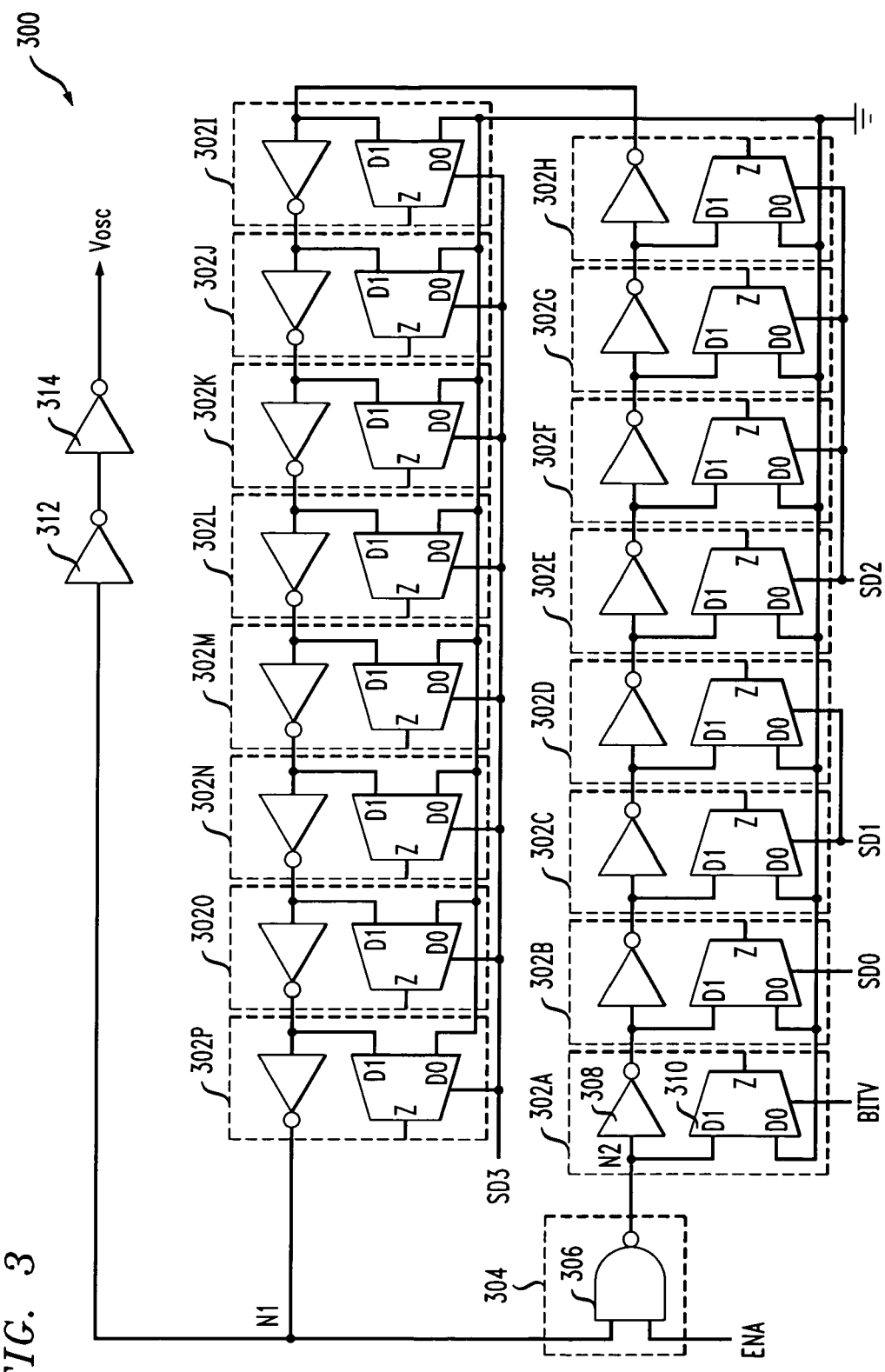
FIG. 3 is a schematic diagram depicting an exemplary DCO suitable for use in the signal generator circuit of FIG. 1, in accordance with another embodiment of the invention.

FIG. 3 is a schematic diagram depicting an exemplary DCO 300 suitable for use in the signal generator circuit 100 of FIG. 1, in accordance with another embodiment of the invention. Like the DCO 200 shown in FIG. 2, exemplary DCO 300 includes a plurality of delay stages 302A through 302P connected together in a ring configuration as shown, with an output of one delay stage (e.g., 302A) connected to an input of a successive delay stage (e.g., 302B), and so forth until the ring is closed by connecting an output of the last delay stage, 302P, at node N1 to an input of the first delay stage, 302A, at node N2, either directly or via an enable circuit 304, or an alternative switching arrangement. The delay stages may be referred to collectively as 302. In this illustrative embodiment, enable circuit 304 comprises a logical NAND gate 306 adapted to receive the output from the last delay stage 302P and an enable signal, ENA, and to generate the input signal to the first delay stage 302A. In this manner, when enable signal ENA is a logic low level (e.g., "0"), oscillation in the DCO 300 will be suspended. DCO 300 is operative to generate an output signal, Vosc, preferably as a tap off one of the delay stages (e.g., 302P at node N1). The output signal Vosc may be a buffered version of the output of a given one of the delay stages, such as by using a pair of inverters 312 and 314 or an alternative buffer arrangement.

Each of the delay stages in the DCO 300, of which delay stage 302A is representative, preferably comprises an inverter 308 and a multiplexer 310. The multiplexer 310 includes a first input D1 connected to an input of the inverter 308 and a second input D0 connected to a voltage source, which may be ground. Since the multiplexer is essentially only used to provide capacitive loading at the input of the inverter 308, an output Z of the multiplexer 310 may be left unconnected. The multiplexer 310 changes the capacitive loading of the inverter 308 in response to the logical state of a control signal (e.g., BITV) presented thereto. For instance, when BITV is a logic low level, input D0 of the multiplexer 310 is selected and input D1 is floating (e.g., tri-stated), thereby providing no significant capacitive loading to inverter 308. When BITV is a logic high level, input D1 of the multiplexer 310 is selected, thereby increasing the capacitive loading on inverter 308 and increasing the delay associated with delay stage 302A.

The delay of one or more delay stages 302 is preferably selectively adjustable for controlling the frequency of the output signal Vosc as desired. As apparent from the figure, more than one delay stage may receive the same control signal. For example, delay stages 302I, 302J, 302K, 302L, 302M, 302N, 302O and 302P receive control signal SD3, delay stages 302E, 302F, 302G and 302H receive control signal SD2, and delay stages 302D and 302E receive control signal SD1. Control signal SD0, the LSB of the supplied DCO control word, is presented to a single delay stage 302B. Signal BITV, which is preferably given the same weighting as the LSB of the DCO control word, namely, SD0, is presented to a single delay stage 302A.

Figure 4:
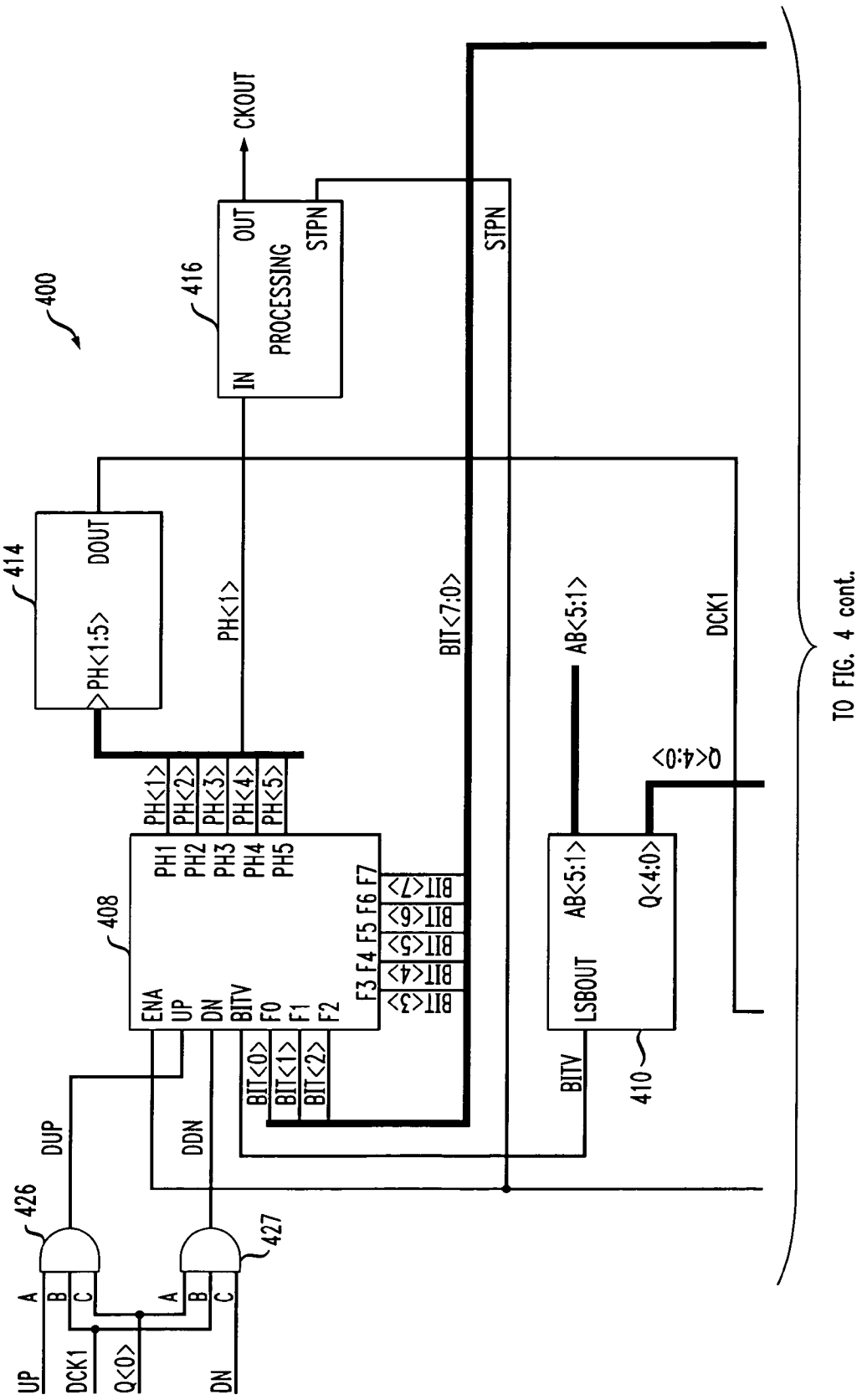
FIG. 4 is a schematic diagram depicting at least a portion of an exemplary signal generator circuit 400, formed in accordance with an embodiment of the invention.
Figure 4:
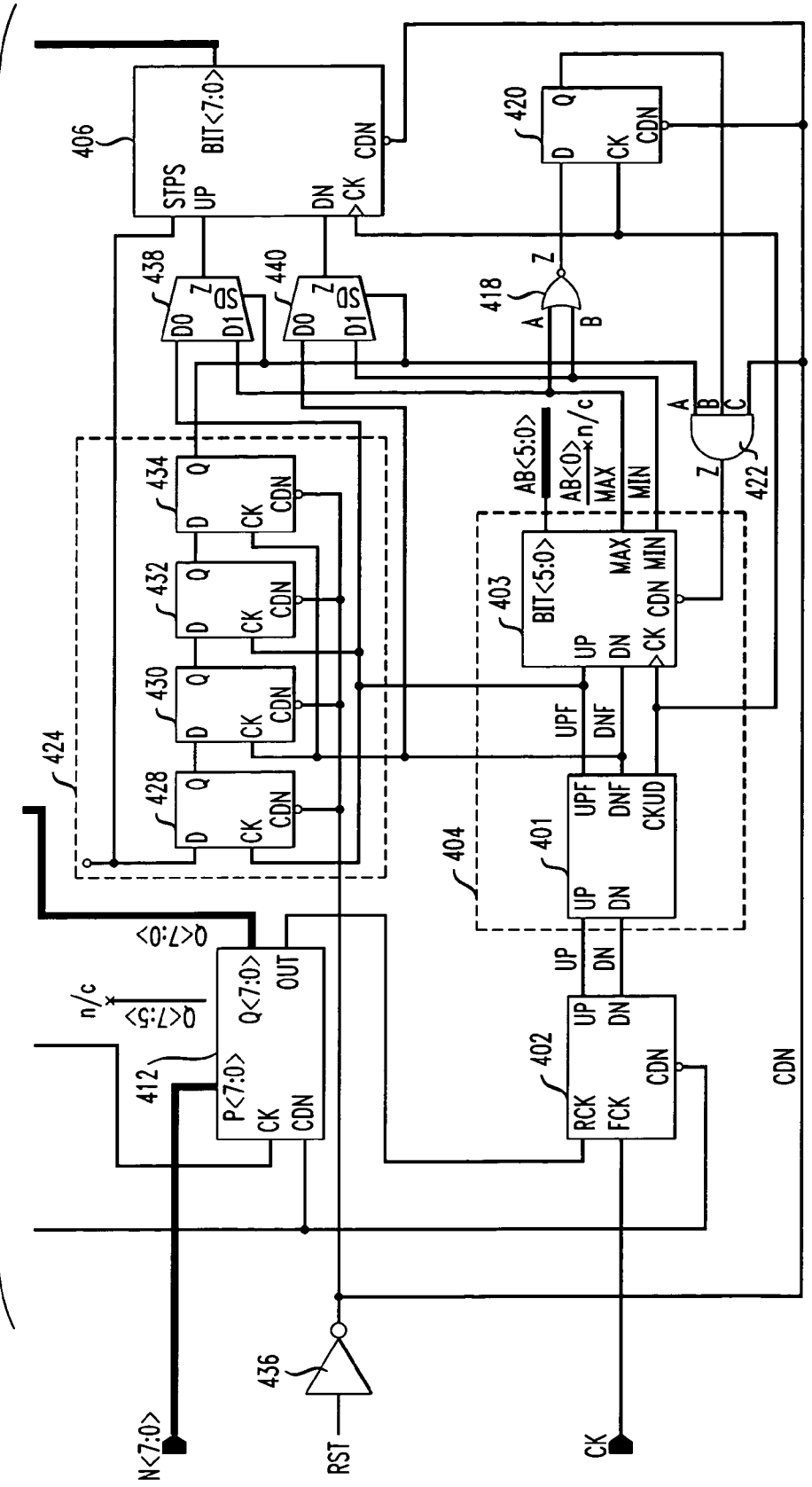

FIG. 4 is a schematic diagram depicting at least a portion of an exemplary signal generator circuit 400, formed in accordance with an illustrative embodiment of the invention. The exemplary signal generator circuit 400 comprises a phase detector 402, an averaging UDC 404, a second UDC 406, a DCO 408, a modulation circuit 410, and a feedback divider 412. Each of these functional blocks may be connected together and implemented as previously described in connection with FIGS. 1-3. The signal generator circuit 400 may also comprise additional circuitry, such as, for example, a phase selection circuit 414 operative to selectively output one of a plurality of clock phases generated by the DCO 408, a processing circuit 416 (which may include, for example, reset circuitry, clock bypass circuitry, a post divider, one or more clock buffers, etc.), and a reset circuit comprising NOR gate 418, D-type flip-flop (DFF) 420 and AND gate 422, configured to set an output AB<5:0> of the averaging UDC 404 to a prescribed value (e.g., mid-value) in response to an overflow or an underflow condition generated by the averaging UDC.

The PFD 402 may generate both UP and DN pulses, one pulse being a minimum pulse width and the other pulse indicating a correction value. In some instances it may be desirable to eliminate the pulse having the minimum pulse width. Therefore, the averaging UDC 404 may comprise a UDC 403, which may be implemented in a conventional fashion, and a filter 401. Filter 401 is preferably configured for substantially eliminating UP and DN pulses received from the PFD 402 having a pulse width associated therewith that is less than a designated minimum width. The filtered UP and DN pulses are represented by the signals UPF and DNF, respectively. Filter 401 may also generate a clock signal CKUD, based at least in part on the UP and DN pulses from the PFD 402, for controlling UDC 403, second UDC 406 and DFF 420.

In the exemplary signal generator circuit 400, the DCO 408 is an eight-bit digitally programmable oscillator having control inputs F0, F1, F2, F3, F4, F5, F6 and F7 for selecting or controlling the delay of one or more delay stages therein. A suitable DCO architecture for use with the signal generator circuit 400 is shown in FIGS. 2 and 3, although it is contemplated that alternative variable frequency generator circuit configurations may also be employed. The digital output count, comprising BIT<7>(MSB), BIT<6>, BIT<5>, BIT<4>, BIT<3>, BIT<2>, BIT<1> and BIT<0>(LSB), generated by the second UDC 406 is preferably supplied to corresponding control inputs (e.g., F7, F6, F5, F4, F3, F2, F1, F0, respectively) of the DCO 408. The UP and DN pulses generated by the PFD 402 are preferably fed to a synchronizing circuit comprising logical AND gates 426 and 427. A first input (A) of AND gate 426 is adapted to receive the UP pulse, a first input (C) of AND gate 427 is adapted to receive the DN pulse, second inputs (B) of AND gates 426 and 427 are adapted to receive a clock signal, DCK1, generated at an output, DOUT, of phase selection circuit 414, and a third input (C) of AND gate 426 and a third input (A) of AND gate 427 are adapted to receive the LSB Q<0> of the output count generated by feedback divider 412. Preferably, feedback divider 412 comprises a programmable divider which is configured for providing a selectable divide value based on one or more divider select signals, N<7:0>, presented to the signal generator circuit 400. AND gates 426 and 427 are operative to generate output signals DUP and DDN, respectively, which are fed to corresponding control inputs UP and DN of the DCO 408. Signals DUP and DDN are essentially clocked versions of the UP and DN pulses, respectively, having edges that are substantially aligned with edges of the clock signal DCK1 and output count Q<0>. Signal DCK1 is a selected one of the plurality of output clock phases, PH1, PH2, PH3, PH4 or PH5, generated by the DCO 408. Phase selection circuit 414 may comprise, for example, a multiplexer or alternative switching means.

In order to provide enhanced control resolution in the signal generator circuit 400, the DCO 408 includes at least one additional control input, BITV, for controlling the frequency of the output signal generated by the DCO. Modulation circuit 410 is preferably operative to generate the control signal BITV which is fed to the DCO 408. The five most significant bits, AB<5>, AB<4>, AB<3>, AB<2>, AB<1>, of the output count generated by the averaging UDC 404 are preferably fed to modulation circuit 410. As apparent from the figure, least significant bit AB<0> of the output count generated by the averaging UDC 404 is not used in the illustrative embodiment, and therefore becomes part of the averaging. Bit AB<0> can also be used for expanding the DCO 408 to a nine-bit programmable oscillator, if desired. In addition, the five least significant bits, Q<4>, Q<3>, Q<2>, Q<1>, Q<0>, of the output count generated by feedback divider 412 are preferably fed to modulation circuit 410. Signal BITV is preferably generated as a time modulation of at least a portion of the output count (e.g., AB<5:1>) from the averaging UDC 404 and at least a portion of the output count (e.g., Q<4:0>) from the feedback divider 412, in accordance with an aspect of the invention. Modulation circuit 410 is preferably configured such that the LSB of the counter (e.g., AB<1>) is modulated by the MSB of the feedback divider (e.g., Q<4>).

The BITV control input of the DCO 408 is preferably afforded the same weight as the LSB of the DCO control word, namely, input F0, and the circuitry inside the DCO associated with control inputs F0 and BITV is substantially similar. The bits BIT<7:0> of the DCO control word applied to corresponding control inputs F7 through F0 of the DCO 408 will change relatively slowly, at less than the PFD input clock rate (e.g., less than the rate of signal CK supplied to the signal generator circuit 400). However, control signal BITV is modulated by the feedback divider bits Q<4:0> with the averaging UDC bits AB<5:1>. This creates an effective weight for bit AB<5> equal to about one-half of an LSB, an effective weight for bit AB<4> equal to about one-quarter of an LSB, an effective weight for bit AB<3> equal to about one eighth of an LSB, and so on, thereby providing enhanced control resolution without the need for expanding the number of delay stages in the DCO 408 or adding additional complex circuitry to the signal generator circuit 400.

The signal generator circuit 400 may include a control circuit 424 that is configurable for bypassing the averaging UDC 404, at least initially (e.g., prior to frequency locking). During start-up, for example, control circuit 424 is preferably operational in a bypass mode wherein the averaging UDC 404 is bypassed to allow the signal generator circuit 400 to more quickly determine an approximate divide value, thereby speeding the locking process. While in the bypass mode, the averaging UDC may be held to a prescribed count value, such as, for example, a mid-scale value. Additionally, the second UDC 406 is preferably configured to receive the filtered UP and DN signals UPF, DNF via multiplexers 438 and 440, respectively. After a designated number of clock cycles (e.g., eight), control circuit 424 preferably switches to a normal mode of operation in which the second UDC 406 is able to control the DCO 408. During the normal mode, the second UDC 406 is preferably configured to receive overflow and underflow signals MAX and MIN from the averaging UDC 404 via multiplexers 438 and 440, respectively.

The control circuit 424 in the exemplary signal generator circuit 400 comprises four DFFs 428, 430, 432 and 434 configured as a divide-by-eight counter. It is to be appreciated that the invention is not limited to the precise circuit arrangement shown in the figure. One or more of the DFFs may be clocked by the filtered UP and DN signals UPF and DNF, respectively. For example, DFFs 428 and 432 are clocked by signal UPF, and DFFs 430 and 434 are clocked by signal DNF. The control circuit 424 preferably generates an output signal that is supplied to an input (A) of AND gate 422 in the averaging UDC reset circuit.

Reset circuitry, which may be included in processing circuit 416, is preferably operative to generate a stop signal, STPN, for disabling DCO 408 and for resetting one or more of PFD 402 and feedback divider 412. An additional reset signal, RST, supplied to the signal generator circuit 400, possibly through an inverter 436 or alternative buffer arrangement, which, when asserted (e.g., a logic "1"), may also be employed to selectively reset one or more of control circuit 434, averaging UDC 404 (via AND gate 422), second UDC 406, and DFF 420. The reset circuitry in processing circuit 416 may further be configured to stop the DCO 408 without resetting the averaging UDC 404 or the second UDC 406. This permits the signal generator circuit 400 to be selectively stopped, in response to an assertion of stop signal STPN, and to subsequently resume operation at the same frequency as before the stop signal was asserted. This may useful, for example, as part of a power saving mode of operation.

Figure 5:
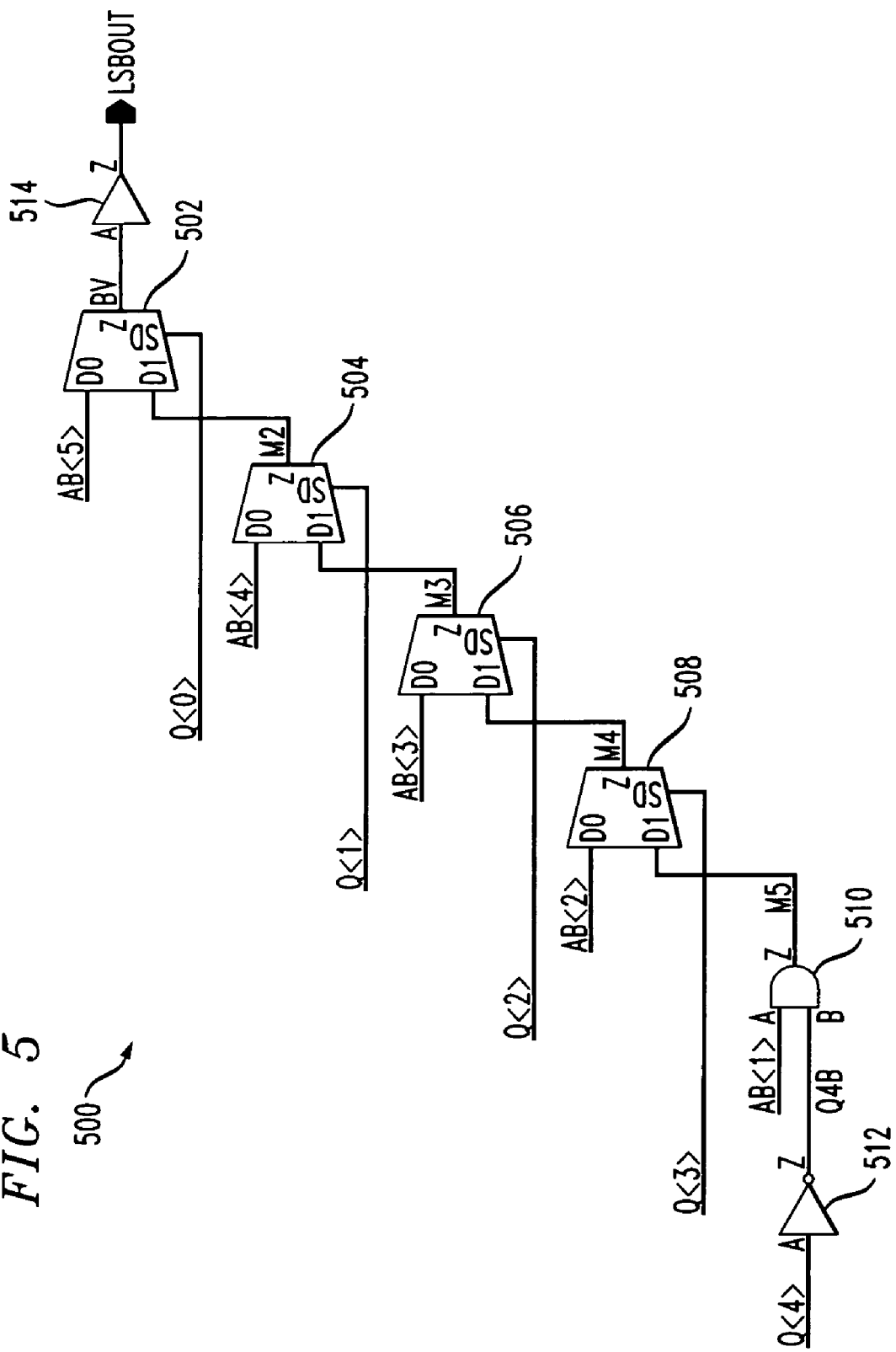
FIG. 5 is a schematic diagram depicting at least a portion of an exemplary modulation circuit suitable for use in the illustrative signal generator circuit of FIG. 1, in accordance with one embodiment of the invention.

FIG. 5 is a schematic diagram depicting at least a portion of an exemplary modulation circuit 500 suitable for use in the signal generator circuit 400 shown in FIG. 4, in accordance with an embodiment of the present invention. The modulation circuit 500 preferably comprises a plurality of multiplexers, 502, 504, 506 and 508, each of the multiplexers (MUX) including a first input (D0) adapted to receive a corresponding one of the averaging UDC counter bits, AB<5>, AB<4>, AB<3> and AB<2>, respectively. A second input, D1, of each of the multiplexers 502, 504, 506, 508, is preferably adapted to receive an output signal generated by a preceding one of the multiplexers. Specifically, the second input of MUX 502 is preferably adapted to receive signal M2 generated at an output, Z, of MUX 504, the second input of MUX 504 is preferably adapted to receive signal M3 generated at an output of MUX 506, and the second input of MUX 506 is preferably adapted to receive signal M4 generated at an output of MUX 508.

Averaging UDC counter bit AB<1> is preferably fed to a first input, A, of a logical AND gate 510. A second input, B, of AND gate 510 is preferably adapted to receive a logical complement of feedback divider count bit Q<4>, namely, Q4B, which may be generated by an inverter 512, or alternative logical inversion circuitry. The remaining feedback counter bits, Q<3:0>, are preferably employed as control signals for selecting, as an output, one of the two input signals presented to each multiplexer. Specifically, bit Q<3> is fed to a select data (SD) input of MUX 508, bit Q<2> is fed to the select data input of MUX 506, bit Q<1> is fed to the select data input of MUX 504, and bit Q<0> is fed to the select data input of MUX 502. In this manner, signal M4 generated by MUX 508 is a function of the logical level of bit Q<3>, signal M3 generated by MUX 506 is a function of the logical level of bit Q<2>, signal M2 generated by MUX 504 is a function of the logical level of bit Q<1>, and signal BV generated by MUX 502 is a function of the logical level of bit Q<0>.

The output signal BV generated by MUX 502 is preferably fed to a buffer 514, or alternative buffering arrangement, such that an output signal, LSBOUT, of the modulation circuit 500 is preferably a buffered version of the signal BV. Bit AB<5> will be selected as an output of the modulation circuit 500 whenever Q<0> is a logic high ("1") level, and therefore AB<5> can be represented as Q<0>. Bit AB<4> will be selected as an output of the modulation circuit 500 whenever Q<1> is high and Q<0> is a logic low ("0") level, and therefore AB<4> can be represented by the relation Q0B*Q<1>, where Q0B corresponds to a logical complement of Q<0> and the symbol "*" corresponds to a logical AND operation. Bit AB<3> will be selected as an output of the modulation circuit 500 whenever Q<0> is low, Q<1> is low, and Q<2> is high, and therefore AB<3> can be represented by the relation Q0B*Q1B*Q<2>, where Q1B corresponds to a logical complement of Q<1>. Bit AB<2> will be selected as an output of the modulation circuit 500 whenever Q<0> is low, Q<1> is low, Q<2> is low, and Q<3> is high, and therefore AB<2> can be represented by the relation Q0B*Q1B*Q2B*Q<3>, where Q2B corresponds to a logical complement of Q<2>. Bit AB<1> will be selected as an output of the modulation circuit 500 whenever Q<0> is low, Q<1> is low, Q<2> is low, Q<3> is low, and Q<4> is high, and therefore AB<1> can be represented by the relation Q0B*Q1B*Q2B*Q3B*Q<4>, where Q3B corresponds to a logical complement of Q<3>.

A logical truth table indicating the effective averaging UDC bit for each corresponding feedback count value (Q<4:0>) in the modulation circuit 500 is shown in Table 1 below, where the effective bit represents an equivalent value of the output signal LSBOUT generated by the modulation circuit 500 for a given feedback count value.

TABLE 1

| | | LSBOUT Bit Pattern | | | | |
|---|---|---|---|---|---|---|
| Q<4:0> | AB<5> | AB<4> | AB<3> | AB<2> | AB<1> | Effective Bit |
| 00000 | 1 | 0 | 0 | 0 | 0 | AB<5> |
| 00001 | 0 | 1 | 0 | 0 | 0 | AB<4> |
| 00010 | 1 | 0 | 0 | 0 | 0 | AB<5> |
| 00011 | 0 | 0 | 1 | 0 | 0 | AB<3> |
| 00100 | 1 | 0 | 0 | 0 | 0 | AB<5> |
| 00101 | 0 | 1 | 0 | 0 | 0 | AB<4> |
| 00110 | 1 | 0 | 0 | 0 | 0 | AB<5> |
| 00111 | 0 | 0 | 0 | 1 | 0 | AB<2> |
| 01000 | 1 | 0 | 0 | 0 | 0 | AB<5> |
| 01001 | 0 | 1 | 0 | 0 | 0 | AB<4> |
| 01010 | 1 | 0 | 0 | 0 | 0 | AB<5> |
| 01011 | 0 | 0 | 1 | 0 | 0 | AB<3> |
| 01100 | 1 | 0 | 0 | 0 | 0 | AB<5> |
| 01101 | 0 | 1 | 0 | 0 | 0 | AB<4> |
| 01110 | 1 | 0 | 0 | 0 | 0 | AB<5> |
| 01111 | 0 | 0 | 0 | 0 | 1 | AB<1> |
| 10000 | 1 | 0 | 0 | 0 | 0 | AB<5> |
| 10001 | 0 | 1 | 0 | 0 | 0 | AB<4> |
| 10010 | 1 | 0 | 0 | 0 | 0 | AB<5> |
| 10011 | 0 | 0 | 1 | 0 | 0 | AB<3> |
| 10100 | 1 | 0 | 0 | 0 | 0 | AB<5> |
| 10101 | 0 | 1 | 0 | 0 | 0 | AB<4> |
| 10110 | 1 | 0 | 0 | 0 | 0 | AB<5> |
| 10111 | 0 | 0 | 0 | 1 | 0 | AB<2> |
| 11000 | 1 | 0 | 0 | 0 | 0 | AB<5> |
| 11001 | 0 | 1 | 0 | 0 | 0 | AB<4> |
| 11010 | 1 | 0 | 0 | 0 | 0 | AB<5> |
| 11011 | 0 | 0 | 1 | 0 | 0 | AB<3> |
| 11100 | 1 | 0 | 0 | 0 | 0 | AB<5> |
| 11101 | 0 | 1 | 0 | 0 | 0 | AB<4> |
| 11110 | 1 | 0 | 0 | 0 | 0 | AB<5> |
| 11111 | 0 | 0 | 0 | 0 | 0 | 0 |

By way of example only, consider a four-stage DCO configured to run at periods of 700 picoseconds (ps), 800 ps, 900 ps, or 1000 ps. Using a binary control arrangement, the DCO would require a two-bit control word. Assume that an application in which the DCO is to be employed requires an output frequency of approximately 300 MHz, or 3333 ps, so the output of the DCO must be divided by four. The divide by four periods available would be 2800 ps, 3200 ps, 3600 ps, and 4000 ps. If the DCO is modulated between 800 ps and 900 ps, so as to approximately generate the desired period of 3333 ps, the jitter in the output signal due to the modulation is 100 ps at the DCO. Unfortunately, the jitter would be 400 ps at the target frequency since the DCO output frequency must be multiplied by four.

Now suppose another stage is added to the DCO and the DCO is reconfigured to run at five different periods, namely, 650 ps, 750 ps, 850 ps, 950 ps, and 1050 ps. Using a binary control arrangement, the DCO would require a three-bit control word for selecting one of the five periods. Four of these periods can be controlled in a binary manner from the UDC, and the next two lower bits of the UDC are preferably used to modulate the added LSB. As the DCO is counted down, for the four states a table can be created which modulates the added LSB so that the four DCO periods of count down can be modulated faster or slower. This yields the following divided down DCO periods: 2600 ps, 2700 ps, 2800 ps, 2900 ps, 3000 ps, 3100 ps, 3200 ps, 3300 ps, 3400 ps, 3500 ps, 3600 ps, 3700 ps, 3800 ps, 3900 ps, 4000 ps, 4100 ps, and 4200 ps. Thus, in accordance with illustrative embodiments of the invention, the control resolution of the DCO at the target frequency is 100 ps, rather than 400 ps. Moreover, the enhanced control resolution is provided without significantly complicating the original DCO design. It is to be appreciated that the techniques of the illustrative embodiments of the invention described herein are not limited to any particular arrangement for the DCO and/or for the signal generator circuit.

At least a portion of the signal generator circuit of the present invention may be implemented in an integrated circuit. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A signal generator circuit having enhanced control resolution, comprising:
   a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals;
   a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;
   a first counter configurable for generating an output count based at least in part on the difference signal from the comparator, the output count being a digital representation of the difference signal, the output count comprising the first signal;
   a first divider connected between the variable frequency oscillator and the comparator, the first divider having a selectable divide value associated therewith and being configurable for receiving the output signal from the variable frequency oscillator and for generating the fourth signal based on the divide value; and
   a modulation circuit adapted to receive at least a portion of the output count and the fourth signal and to generate the second signal as a function of the output count and the fourth signal.

2. A signal generator circuit having enhanced control resolution, comprising:
   a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals;
   a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;
   a first counter configurable for generating an output count based at least in part on the difference signal from the comparator, the output count being a digital representation of the difference signal, the output count comprising the first signal;
   a first divider connected between the variable frequency oscillator and the comparator, the first divider having a selectable divide value associated therewith and being configurable for receiving the output signal from the variable frequency oscillator and for generating the fourth signal based on the divide value; and
   a modulation circuit adapted to receive at least a portion of the output count and the fourth signal and to generate the second signal as a function of the output count and the fourth signal;
   wherein the modulation circuit is configured such that a least significant bit of the output count generated by the first counter is modulated by a most significant bit of the fourth signal generated by the first divider.

3. The circuit of claim 2, wherein most significant bit of the output count is modulated by a least significant bit of the fourth signal.

4. A signal generator circuit having enhanced control resolution, comprising:
   a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals;
   a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;
   a first counter configurable for generating an output count based at least in part on the difference signal from the comparator, the output count being a digital representation of the difference signal, the output count comprising the first signal;
   a first divider connected between the variable frequency oscillator and the comparator, the first divider having a selectable divide value associated therewith and being configurable for receiving the output signal from the variable frequency oscillator and for generating the fourth signal based on the divide value; and a modulation circuit adapted to receive at least a portion of the output count and the fourth signal and to generate the second signal as a function of the output count and the fourth signal;

wherein, for an n-bit output count supplied to the modulation circuit, the modulation circuit comprises n−1 multiplexers, each of the multiplexers including a first input adapted for receiving a corresponding bit of the n-bit output count, a second input adapted for receiving an output signal of a preceding one of the multiplexers, and a control input adapted for receiving a corresponding bit of the fourth signal, where n is an integer greater than one.

5. The circuit of claim 4, wherein the first input of a first of the multiplexers is adapted to receive a most significant bit of the output count, the first multiplexer being operative to generate the modulated bit signal, and the control input of the first multiplexer is adapted to receive a most significant bit of the fourth signal.

6. The circuit of claim 1, wherein the first counter is further configurable for generating a fifth control signal in response to the first counter generating one of an overflow and an underflow, the divide value in the first divider being selected based on the fifth signal.

7. A signal generator circuit having enhanced control resolution, comprising:

a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals;

a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;

a first counter configurable for generating an output count based at least in part on the difference signal from the comparator, the output count being a digital representation of the difference signal, the output count comprising the first signal;

a first divider connected between the variable frequency oscillator and the comparator, the first divider having a selectable divide value associated therewith and being configurable for receiving the output signal from the variable frequency oscillator and for generating the fourth signal based on the divide value;

a modulation circuit adapted to receive at least a portion of the output count and the fourth signal and to generate the second signal as a function of the output count and the fourth signal; and a second counter configurable for generating an output count in response to the first counter generating one of an overflow and an underflow, the output count of the second counter representing a duration of one of the overflow and the underflow of the first counter, the divide value of the first divider being selected based on the output count of the second counter.

8. A signal generator circuit having enhanced control resolution, comprising:

a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals:

a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;

a first counter configurable for generating an output count based at least in part on the difference signal from the comparator, the output count being a digital representation of the difference signal, the output count comprising the first signal;

a first divider connected between the variable frequency oscillator and the comparator, the first divider having a selectable divide value associated therewith and being configurable for receiving the output signal from the variable frequency oscillator and for generating the fourth signal based on the divide value; and a modulation circuit adapted to receive at least a portion of the output count and the fourth signal and to generate the second signal as a function of the output count and the fourth signal;

wherein the difference signal being a first value causes the output count of the first counter to increase and the frequency of the output signal from the variable frequency generator to decrease, and the difference signal being a second value causes the output count of the first counter to decrease and the frequency of the output signal from the variable frequency generator to increase.

9. The circuit of claim 1, wherein the difference signal being a first value causes the output count of the first counter to increase and the frequency of the output signal from the variable frequency generator to increase, and the difference signal being a second value causes the output count of the first counter to decrease and the frequency of the output signal from the variable frequency generator to decrease.

10. A signal generator circuit having enhanced control resolution, comprising:

a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals;

a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;

a first counter configurable for generating an output count based at least in part on the difference signal from the comparator, the output count being a digital representation of the difference signal, the output count comprising the first signal;

a first divider connected between the variable frequency oscillator and the comparator, the first divider having a selectable divide value associated therewith and being configurable for receiving the output signal from the variable frequency oscillator and for generating the fourth signal based on the divide value; and a modulation circuit adapted to receive at least a portion of the output count and the fourth signal and to generate the second signal as a function of the output count and the fourth signal;

wherein the variable frequency generator comprises a plurality of delay stages including first and last stages, the plurality of delay stages being connected in a ring configuration, such that an output of a given delay stage is coupled to an input of a successive delay stage, the output of the last stage being operatively coupled to the input of the first stage.

11. The circuit of claim 1, wherein the first counter comprises an up/down counter.

12. The circuit of claim 1, wherein the first divider comprises a programmable counter.

13. The circuit of claim 1, wherein the comparator comprises at least one of a phase detector and a frequency detector.

14. The circuit of claim 1, wherein the first signal comprises a digital control word and the second signal comprises a modulated bit signal.

15. The circuit of claim 1, wherein the variable frequency oscillator is a digitally controlled oscillator.

16. The circuit of claim 1, wherein the signal generator circuit is included in a digital phase locked loop circuit.

17. An integrated circuit including at least one signal generator circuit having enhanced control resolution, the at least one signal generator circuit comprising:

a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals;

a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;

a first counter configurable for generating an output count based at least in part on the difference signal from the comparator, the output count being a digital representation of the difference signal, the output count comprising the first signal;

a first divider connected between the variable frequency oscillator and the comparator, the first divider having a selectable divide value associated therewith and being configurable for receiving the output signal from the variable frequency oscillator and for generating the fourth signal based on the divide value; and a modulation circuit adapted to receive at least a portion of the output count and the fourth signal and to generate the second signal as a function of the output count and the fourth signal.

18. An integrated circuit including at least one signal generator circuit having enhanced control resolution, the at least one signal generator circuit comprising:

a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals;

a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;

a first counter configurable for generating an output count based at least in part on the difference signal from the comparator, the output count being a digital representation of the difference signal, the output count comprising the first signal;

a first divider connected between the variable frequency oscillator and the comparator, the first divider having a selectable divide value associated therewith and being configurable for receiving the output signal from the variable frequency oscillator and for generating the fourth signal based on the divide value; and a modulation circuit adapted to receive at least a portion of the output count and the fourth signal and to generate the second signal as a function of the output count and the fourth signal;

wherein the modulation circuit is configured such that a least significant bit of the output count generated by the first counter is modulated by a most significant bit of the fourth signal generated by the first divider.

19. An integrated circuit including at least one signal generator circuit having enhanced control resolution, the at least one signal generator circuit comprising:

a variable frequency oscillator including a first control input adapted to receive a first signal and at least a second control input adapted to receive a second signal, the second signal being afforded a weight which is substantially equal to a weight of a least significant bit of the first signal, the variable frequency oscillator being operative to generate an output signal having a frequency which varies as a function of the first and second signals;

a comparator configurable for receiving a third signal and a fourth signal, the third signal being an input signal presented to the signal generator circuit and the fourth signal being representative of the output signal from the variable frequency oscillator, the comparator generating a difference signal representative of a difference between at least one of a phase and a frequency of the third and fourth signals;

a first counter configurable for generating an output count based at least in part on the difference signal from the comparator, the output count being a digital representation of the difference signal, the output count comprising the first signal;

a first divider connected between the variable frequency oscillator and the comparator, the first divider having a selectable divide value associated therewith and being configurable for receiving the output signal from the variable frequency oscillator and for generating the fourth signal based on the divide value; and a modulation circuit adapted to receive at least a portion of the output count and the fourth signal and to generate the second signal as a function of the output count and the fourth signal;

wherein, for an n-bit output count supplied to the modulation circuit, the modulation circuit comprises n−1 multiplexers, each of the multiplexers including a first input adapted for receiving a corresponding bit of the n-bit output count, a second input adapted for receiving an output signal of a preceding one of the multiplexers, and a control input adapted for receiving a corresponding bit of the fourth signal, where n is an integer greater than one.

20. The integrated circuit of claim 19, wherein the first input of a first of the multiplexers is adapted to receive a most significant bit of the output count, the first multiplexer being operative to generate the modulated bit signal, and the control input of the first multiplexer is adapted to receive a most significant bit of the fourth signal.

* * * * *